United States Patent
Garcia et al.

(10) Patent No.: US 8,613,622 B2
(45) Date of Patent: Dec. 24, 2013

(54) INTERCONNECTION INTERFACE USING TWIST PINS FOR TESTING AND DOCKING

(75) Inventors: Steven E. Garcia, Kemah, TX (US); Douglas R. Kocher, Happy Valley, OR (US)

(73) Assignee: Medallion Technology, LLC, Houston, TX (US)

( * ) Notice: Subject to any disclaimer, the term of this patent is extended or adjusted under 35 U.S.C. 154(b) by 113 days.

(21) Appl. No.: 13/028,098

(22) Filed: Feb. 15, 2011

(65) Prior Publication Data

US 2012/0208381 A1    Aug. 16, 2012

(51) Int. Cl.
*H01R 12/00*    (2006.01)

(52) U.S. Cl.
USPC .............................................. 439/66; 439/75

(58) Field of Classification Search
USPC .................. 439/66, 75; 324/750.26
See application file for complete search history.

(56) References Cited

U.S. PATENT DOCUMENTS

| | | | |
|---|---|---|---|
| 2,064,545 A | 12/1936 | Kleinmann et al. | |
| 2,752,580 A | 6/1956 | Shewmaker | |
| 3,017,605 A | 1/1962 | Platz et al. | |
| RE25,798 E | 6/1965 | Platz et al. | |
| 3,205,469 A | 9/1965 | Frank et al. | |
| 3,255,430 A | 6/1966 | Phillips | |
| 3,258,736 A | 6/1966 | Crawford et al. | |
| 3,277,560 A | 10/1966 | Frank et al. | |
| 3,319,217 A | 5/1967 | Phillips | |
| 3,333,225 A | 7/1967 | McNutt | |
| 3,400,358 A | 9/1968 | Byrnes et al. | |
| 3,402,466 A | 9/1968 | Phillips | |
| 4,076,356 A | 2/1978 | Tamburro | |
| 4,358,180 A | 11/1982 | Lincoln | |
| 4,505,529 A | 3/1985 | Barkus | |
| 4,706,097 A | 11/1987 | Harmon | |
| 4,773,877 A | 9/1988 | Kruger et al. | |
| 4,843,315 A | 6/1989 | Bayer et al. | |
| 4,889,496 A | 12/1989 | Neidich | |
| 4,911,645 A | 3/1990 | August et al. | |
| 4,917,547 A | 4/1990 | Frederickson et al. | |
| 4,961,709 A * | 10/1990 | Noschese | 439/66 |
| 5,050,295 A | 9/1991 | Sullivan et al. | |
| 5,051,108 A | 9/1991 | Lincoln | |
| 5,054,192 A | 10/1991 | Cray et al. | |
| 5,106,310 A | 4/1992 | Krajewski et al. | |

(Continued)

FOREIGN PATENT DOCUMENTS

JP    55-133549    10/1980
JP    55-133550    10/1980

(Continued)

OTHER PUBLICATIONS

Technit Interconnection Products, Standard Fuzz Button Contacts, 2 pages, Mar. 15, 2002.

*Primary Examiner* — Hien Vu
(74) *Attorney, Agent, or Firm* — John R. Ley

(57) ABSTRACT

A twist pin is used as an interconnect interface to conduct signals to and from an electronic component. The twist pin includes a bulge which establishes compressive contact force with a sidewall of a via in which the twist pin resides, and the resulting force resists movement of the end of the twist pin away from the electronic component to assure good signal conductivity. The arrangement may be used as a test socket for testing integrated circuit components or permanently docking electronic components.

32 Claims, 9 Drawing Sheets

(56) References Cited

U.S. PATENT DOCUMENTS

| | | |
|---|---|---|
| 5,129,830 A | 7/1992 | Krajewski et al. |
| RE34,084 E | 9/1992 | Noschese |
| 5,184,400 A | 2/1993 | Cray et al. |
| 5,189,507 A | 2/1993 | Carlomagno et al. |
| 5,195,237 A | 3/1993 | Cray et al. |
| 5,388,998 A * | 2/1995 | Grange et al. ............... 439/66 |
| 5,667,410 A | 9/1997 | Johnston |
| 6,043,666 A | 3/2000 | Kazama |
| 6,127,835 A | 10/2000 | Kocher et al. |
| 6,175,243 B1 | 1/2001 | Kocher et al. |
| 6,292,004 B1 | 9/2001 | Kocher |
| 6,512,389 B1 * | 1/2003 | Kocher .................. 324/750.26 |
| 6,716,038 B2 * | 4/2004 | Garcia ............................ 439/75 |
| 6,846,184 B2 * | 1/2005 | Fan et al. ....................... 439/66 |

FOREIGN PATENT DOCUMENTS

| | | |
|---|---|---|
| JP | 56-8837 | 1/1981 |
| JP | 63-208237 | 8/1988 |
| JP | 63-293845 | 11/1988 |
| JP | 3-209173 | 9/1991 |
| JP | 3-209174 | 9/1991 |

* cited by examiner

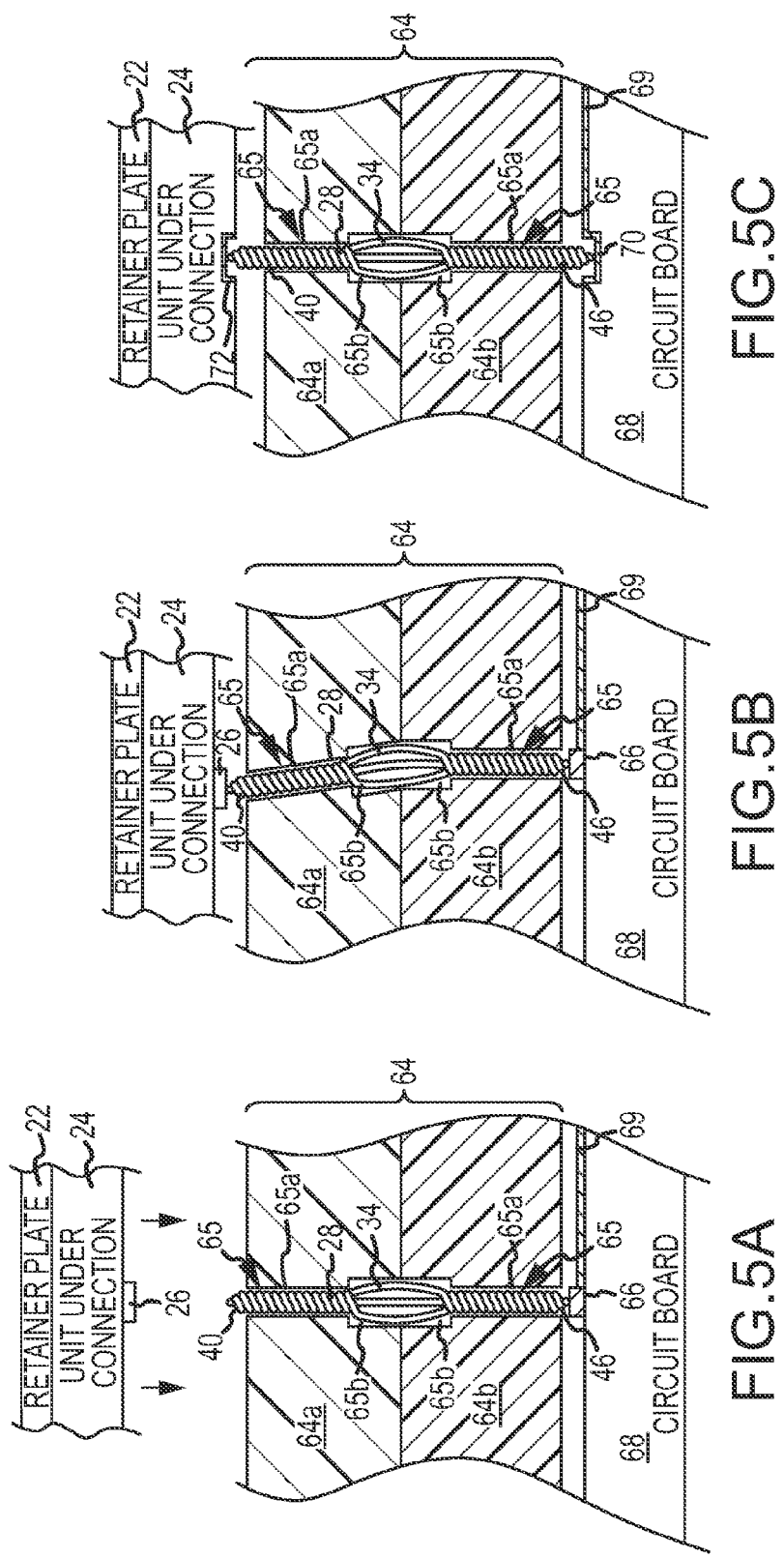

INTERCONNECTION INTERFACE USING TWIST PINS FOR TESTING AND DOCKING

This invention relates to interconnecting electronic components, both on a temporary basis for purposes of testing and on a permanent basis for purposes of creating a product. More particularly, the present invention relates to a new and improved interconnection interface which utilizes twist pins to achieve improved signal conductivity to high-performance electronic components, such as microprocessors, memories and other integrated circuits, on a more reliable, rapidly-accomplished and cost-efficient basis.

BACKGROUND OF THE INVENTION

A twist pin is an elongated electrical conductor formed from multiple helically coiled strands of wire. At least one longitudinal segment of the coiled strands is untwisted in an anti-helical direction to expand the strands into a resilient bulge. The bulge has a larger diameter than the diameter of the regularly stranded wires of the adjacent portions of the twist pin on the opposite ends of the bulge. The strands of wire are preferably formed from beryllium copper or other electrically conductive material having the necessary stiffness and resiliency to permit the bulge to compress while the regularly twisted strands in the adjacent portions of the twist pin remain substantially unaffected.

Twist pins have been used to interconnect and conduct electrical signals between vertically stacked and spaced apart printed circuit boards. The twist pins are inserted through aligned plated through holes or "vias" in the vertically stacked circuit boards with the bulges contacting the conductive sidewalls of the vias. Conventional traces on the printed circuit boards, which connect to the vias, conduct signals to and from the twist pins in the vias. If the signal is not to be conducted from the via to the twist pin, a bulge is not formed in the twist pin at the location where the twist pin which extends through that via, or the via is not electrically connected to other components of the printed circuit board. In addition to electrically interconnecting the stack of printed circuit boards, the twist pins also assist in mechanically holding the stack of printed circuit boards together. Because of their vertical connection capability between the stacked printed circuit boards, twist pins are sometimes referred to as "z-axis" interconnectors. Twist pins and their uses are described in U.S. Pat. Nos. 5,014,419, 5,054,192, 5,112,232, 6,584,677, 6,716,038, 6,729,026 and 6,971,415, among others.

Although twist pins have been successfully used as z-axis interconnectors, it is believed that twist pins have not been used in interconnection interfaces for testing high performance integrated circuits, such as microprocessors or memory chips, or for docking electronic components by direct connection to contact pads or surfaces.

Integrated circuits (ICs) are active functional building blocks for most electronic products. Integrated circuits typically contain hundreds of thousands or millions of individual transistors which are connected together to perform sophisticated and complex functions. These integrated circuits, commonly referred to as "chips," are built up as multi-layer structures using complicated and lengthy manufacturing processes. Small contact surfaces or areas called "pads" are formed on the outside of the chip to conduct electrical power to operate the transistors, to apply input signals to stimulate the transistors, and to deliver output signals created by operation of the transistors in response to the input signals.

Due to their highly integrated nature, most modern integrated circuits have many closely spaced contact pads distributed around the periphery of a chip. The chip may have dimensions of less than 0.5 inches on a side, and ten or more contact pads may be formed along each of the four sides of the chip. Normally, fine lead wires, called "leads," are microscopically bonded to each of the contact pads, and the leads are extended from the chip to larger electrical terminals on a much larger plastic housing within which the chip is permanently retained. The plastic housing with its interiorly-confined chip and larger exterior electrical terminals is referred to as a "package" or sometimes simply as an electronic "device." The exterior electrical terminals of the package are spaced further apart and can be more easily contacted mechanically and electrically by conductor traces on a printed circuit board or by other conductors. In some cases the packages are connected to sockets which have a capability to both electrically contact the terminals and hold the package in place, or the electrical terminals of the package are soldered or adhered directly to conductor traces of the printed circuit board.

Because of the complexity of the integrated circuit manufacturing process and the microscopic size of a large number of electronic components which must be integrated into the single chip in a properly functional and interrelated manner, there is a significant risk that a new chip is defective because of discrepancies which occurred during the manufacturing process. For this reason, it is typical that each batch or run of integrated circuits will achieve less than a 100% yield of properly functional chips. Consequently, newly manufactured chips are subjected to various levels of functional tests to identify those that are defective. By identifying defective chips before they are encapsulated in the packages, the cost of manufacturing fully functional electronic components is reduced, since additional costs are not incurred in encapsulating defective chips in packages. Various functional tests, including real-time complete functionality tests at the chip level, are performed whenever economically possible to eliminate the defective chips before they are encapsulated in packages.

Chip level testing is difficult because of the high density of closely-spaced small contact pads on the chip. To test the chip, electrical contact must be made with a significant number of the contact pads. If the chip is to be completely functionally tested, electrical contacts must be made with all of the contact pads. The close spacing or "pitch" of the contact pads has made it difficult or impossible to establish electrical contact with each of the large number of closely pitched contact pads on a rapidly-occurring, cost-efficient and easily-replicated basis. Making electrical contact with the contact pads on a rapidly-occurring, cost-efficient and easily-replicated basis is necessary if the chip is to be tested economically. Electrical test probes cannot quickly and reliably contact to the contact pads, because such probes usually consume more space than the pitch between the densely positioned contact pads. Even if space is available, significant operator attention is required to properly position the probes. For these and other reasons, some chip manufacturers usually do not perform functional tests which confirm the full functionality of the chip, but instead rely on partial functional tests which can be more easily and economically performed by making probe contact with less than all of the contact pads. Of course, using less than a complete functional tests to evaluate a chip increases the risk that the chip will be determined at a later time to be defective in some regard, thereby increasing manufacturing costs due to packaging a partially defective chip and assembling an electronic product using a package with the partially defective chip.

Making good electrical contact of the probes with the contact pads is further complicated because the chip manufacturing process typically results in contact surfaces on the contact pads which are not located in the same plane. The chip manufacturing process builds up multiple layers and components on top of one another by using layer deposition techniques. Since the layers and the components do not necessarily build up evenly and uniformly, it becomes impossible to assure that all of the contact pads on the chip are built up to the same height. Consequently, the surfaces of the contact pads are usually at slightly different relative heights.

Variations in vertical height of the contact pads relative to one another requires that each of the contact probes have the ability to move vertically relative to the other adjoining probes. Vertical movement capability assures that each probe will make firm conductive contact with the contact pad, thereby assuring good signal conductivity between the probe and the contact pad. Insufficient contact results in an unreliable electrical path for communicating signals. An unreliable electrical path may falsely indicate that a chip is functioning incorrectly, when in reality the discrepancy is from the electrical contact with the contact pad and not from the functionality of the chip itself.

Ideally, the force that each probe should exert on a contact pad should be in the range of 1-15 grams, and preferably in the range of 9-15 grams. Usually a contact force of less than 9 grams per contact will not assure an effective signal path. To assure this amount of force on a large number of non-coplanarly located contact pad surfaces, it becomes necessary to force the probes into more forceful contact with the higher-level contact pads compared to the lesser force of the probes on the lower-level contact pads, to assure that all the probes contact all of the pads with adequate force. The relatively small contact force per probe multiplies into a considerable total force on the chip when many contact pads are involved. Such force may be sufficient to crack or otherwise fracture a chip.

The other practical requirement for testing chips is that each of the chips must be tested relatively quickly, in order to achieve mass testing. For the same reasons that full functional testing is superior to partial functional testing, it is desirable to test all of the newly-manufactured chips, rather than do selective testing of less than the entire batch of newly-manufactured chips. Convenience and cost-efficiency in establishing reliable electrical connections is therefore paramount in order to test large numbers of chips.

The convenience, efficiency, force requirements, density and placement considerations for making electrical contact with the contact pads must be taken into account when making interconnect interfaces for the chips. Such interconnect interfaces are sometimes referred to as "test sockets." Test sockets are used to apply electrical power and input signals to a chip or to some other electronic unit under test and to receive output response signals from the chip or unit under test. An exemplary test socket is described in U.S. Pat. No. 6,512,389, among others. Fixtures used with test sockets to test chips are described in U.S. Pat. Nos. 6,127,835, 6,175,243 and 6,292,004, among others.

One of the most advanced test sockets utilizes spring probes, and is described in U.S. Pat. No. 6,512,389. A spring probe is an electrically-conductive, resilient mechanical structure which has the ability to longitudinally adjust its length, usually by slight compression. Spring probes have a variety of different configurations. Each spring probe is retained in an aperture which has been drilled or otherwise formed in a support structure or plate. The apertures are formed in locations which are aligned with the contact pads of the chip to be tested. At least one end of each spring probe projects beyond the support plate. A fixture supports the chip and brings it into adjacency with the support plate while aligning and contacting the projecting tip ends of the spring probes with the contact pads of the chip. Electrical power, input test signals and output response signals are conducted to and from the chip through the spring probes. Electrical conductors connect to the spring probes in order to supply and receive the electrical power and signals. The longitudinal compressibility of each spring probe assures that it will make contact with the variable-height and non-coplanarly-located contact pads. The apertures in the support plate retain the spring probes to assure their registration with the contact pads.

Despite the advantages of spring probe test sockets, they present certain limitations. One limitation involves the physical size of the spring probe itself. Although there are many different configurations of spring probes, all of them generally have a cross-sectional width which is comparable to or greater than the spacing or pitch between the most densely located contact pads on modern chips. Consequently in most modern chips, it becomes impossible to position the spring probes close enough to each other to achieve registration with the contact pads on the chip while still retaining the spring probes in the desired position in the support plate. Consequently, the use of spring probes during testing of modern chips is usually limited to partial functionality tests, since electrical contact with all of the contact pads is not possible.

Another limitation of spring probe test sockets is that each individual spring probe applies a different force to the contact pads according to the degree of compression of each spring probe. The variations in contact force result from the different, non-coplanar levels of the contact pads and variations in the spring coefficients of each spring probe. Variations in contact force have the potential to create sufficient force differentials over the surface of the chip which could cause the chip to fracture or crack before or after the chip is encapsulated in the package. A fracture or crack in the chip could also break the bond of a lead to the contact pad.

Another significant limitation on spring probe test sockets is that spring probes degrade the quality of input test signals supplied to the chip and the quality of the output response signals supplied from the chip, particularly at the very high frequencies at which many modern integrated circuits operate. For example, modern microprocessors operate at switching frequencies in the neighborhood of 3-20 Ghz, and it is expected that the switching speeds will increase even more in the future. At such high frequencies, the quality of the signal path and the environment surrounding the signal path have the potential to create significant influences over the quality of the signals conducted.

The characteristics and quality of the signals conducted by spring probes are influenced by a change of inductance resulting from the variations in length of the spring probes when compressed against the contact pads. The variation in length changes the effective length of the signal path and the impedance of the signal path. The variation in length also changes the characteristics of the electrical field which surrounds the spring probe when it conducts current. The electromagnetic radiation of the electrical field from one spring probe influences the signals conducted by adjoining spring probes, in a manner sometimes referred to as "cross-talk." Variable field effects from one chip to the next makes it difficult or impossible to eliminate the effects of cross-talk on the output response signals. The variable effects also alter the phase relationship between the input and output signals. Variations in phase relationship become extremely significant in determining proper functionality at the high switching frequencies commonly used in modern chips. Proper testing depends on reliably evaluating those phase relationships.

Since effective testing and use of modern chips depends heavily on the quality and phase relationships of the signals applied to and received from those chips, it is very important to minimize individual signal anomalies in a high-performance, reliable, rapid and cost-efficient interconnect interface, used both for chip testing and for more permanent docking of chips in electronic products.

SUMMARY OF THE INVENTION

The present invention uses twist pins in an interconnect interface or test socket to conduct input signals to and output signals from contact pads of an integrated circuit or chip. Twist pins create a substantially uniform-length signal conduction path, thereby minimizing or eliminating anomalous signal effects created by unequal-length probes or conductors. The twist pins establish substantially uniform contact force with each of relatively different height contact pads on a chip, thereby eliminating differential force distributions that may crack or fracture the chip. The physical size of the twist pin is smaller than known spring probes, thereby permitting closer spacing of the twist pins to contact more or all of the closely-spaced contact pads. The twist pins are maintained in alignment for efficient, rapid and cost-effective registration with the contact pads, to assure mass testing productivity and to assure effective permanent docking. The twist pins effectively interact with contact pads having variations of relative heights and with other types of electrical contacts such as solder balls. In general, the use of twist pins as interconnect interfaces offers significant improvements while eliminating or minimizing the limitations of existing and known interconnect interfaces.

In accordance with the invention, the twist pins conduct electrical signals to and from the contact pads on semiconductor or integrated circuit chips, the terminals on packages, or electrical contact surfaces on printed circuit boards, electronic components or other complete electrical or electronic products. Each of these types of devices which receives signals from a twist pin or conducts signals to a twist pin is referred to generically herein as a "unit under connection" (UUC). If the semiconductor chip, integrated circuit chip, package, printed circuit board, electronic component or other complete electrical or electronic product is undergoing test, the UUC may be considered as a "unit under test." If the semiconductor chip, integrated circuit chip, package, printed circuit board, electronic component or other complete electrical or electronic product is permanently connected, the UUC is permanent docked or connected for continued and intended future use.

The twist pins are retained in vias in a support plate or other support structure. Bulges of the twist pins physically contact a sidewall of the vias and create frictional resistance to longitudinal movement of the twist pins within the vias. The UUC and the support plate undergo relative movement to physically contact the ends of the twist pins with the contact pads or other contact areas of the UUC. The twist pins slide within the vias to different degrees to accommodate the differences in relative height of the contact pads. The frictional resistance of the bulge with the sidewall of each via remains approximately constant regardless of the degree of movement of the twist pin in the via. The amount of force of the twist pin against the contact pad is related only to the degree of compression of the bulge against the sidewall of the via. Twist pins having similar bulge characteristics located in vias having similar diameters exert substantially similar forces on each of the contact pads of the UUC, regardless of differences in height of the contact pads and regardless of the difference in movement of each twist pin, unlike the increasing force from a spring probe on a contact pad resulting from the variable compression of the spring probe relative to the height of the contact pad. The uniform force distribution over the UUC, which results from the constant forces exerted by the twist pins on the contact pads, minimizes the risks of cracking or fracturing the chip.

Since the bulges of the twist pins are located at a constant distance from the contacting ends of the twist pins, and because the signals conducted to or from the twist pins enter or leave the twist pins at the points where the bulges contact the sidewalls of the vias, the twist pins create a substantially consistent signal conduction path to all of the contact pads. The constant length between the points where the bulges contact the sidewalls of the vias has the effect of making the electromagnetic field created by each twist pin more uniform and consistent, which has the practical effect of minimizing variations in cross-talk between signals, minimizing undesired phase relationships and minimizing other anomalous signal effects. The bulges in contact with the sidewalls of the vias create a substantial surface area for transferring the signals, thereby enhancing the quality of the individual signals conducted, since high-frequency signals are conducted more on the surfaces of conductors rather than within the interior of the conductors. In general, the consistent signal conduction path created by the twist pins in vias normalizes or minimizes the anomalous signal-influencing factors and establishes a more uniform quality and relationship of the signals conducted to and from the UUC.

Twist pins located in the vias of a support plate are also used to create permanent electrical connections with UUCs. The resulting electrical connections are more reliable than lead-free solder connections which are now required in electronic circuit manufacturing. Use of the twist pins in the vias avoids entirely the problems of whisker effects which are created by lead-free solder connections.

One aspect of the invention involves a support plate for conducting signals to an electronic component. The electronic component has a plurality of contact pads. The support plate has a plurality of vias aligned with the contact pads. Twist pins reside within the vias, and one end of each twist pin extends from the via and contacts each one of the contact pads.

Another aspect of the invention involves a retainer plate which moves an integrated circuit having contact pads into a position relative to the support plate. When the retainer plate moves the integrated circuit toward the support plate, the contact pads contact the ends of the twist pins in the vias of the support plate and the twist pins move longitudinally within the vias to accommodate the twist pins. After the integrated circuit is moved away from the support plate, a reset plate on the opposite side of the support plate from the integrated circuit moves the twist pins in a longitudinal direction within the vias opposite to the direction that the twist pins were moved by the retainer plate, to reset the twist pins to an initial position for contacting the contact pads of another integrated circuit.

Other aspects of the invention involve, among other things, a guide member which surrounds the end of the twist pin to resist tilting when contacting the contact pad, using the physical contact between the twist pin and the via to create a frictional resistance to movement to establish a good electrical connection, using a twist pin with a center bulge in a multi-diameter via of a circuit board, and encapsulating the twist pins within a non-conductive elastomer medium to maintain alignment.

Other aspects and features of the invention, as well as a more complete understanding of the present invention and its scope may be obtained from the accompanying drawings, which are briefly summarized below, from the following detailed description of presently preferred embodiments of the invention, and from the appended claims.

BRIEF DESCRIPTION OF THE DRAWINGS

FIGS. 2A-2D also illustrate a sequence for testing a semiconductor chip or other unit under connection (UUC) in accordance with the present invention.

FIGS. 5A, 5B and 5C are vertical section and elevation views which are similar to FIGS. 2A-2D, FIGS. 3A-3B and FIGS. 4A-4B, showing a further variation of the interconnect interface or test socket shown in FIG. 1, which employs a twist pin encased within an elastomer support plate.

DETAILED DESCRIPTION

Figure 1:
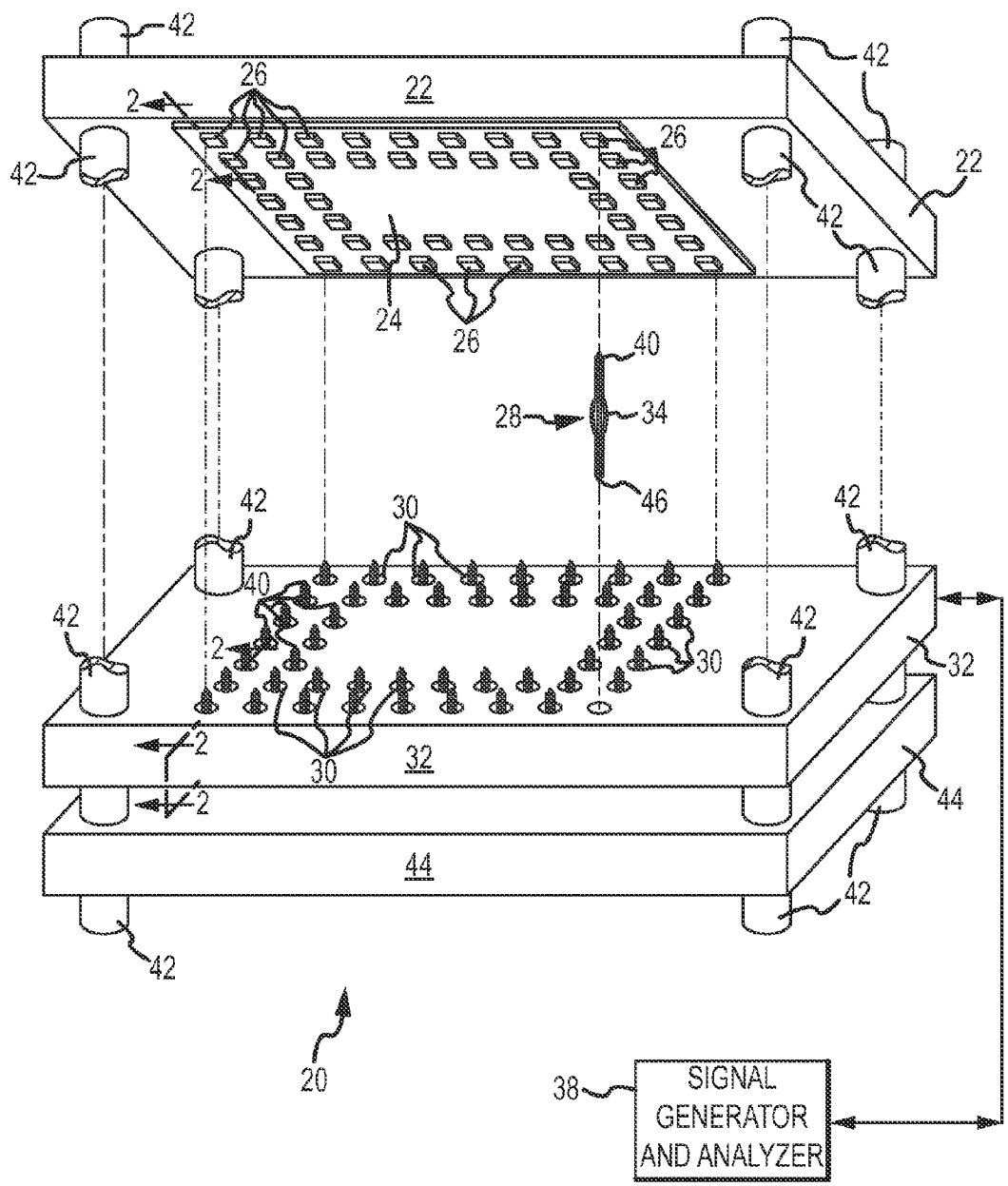
FIG. 1 is an exploded and generalized perspective view of an exemplary interconnect interface or test socket in which the present invention is incorporated, illustrating its use in connection with a semiconductor or integrated circuit chip.

The present invention may be advantageously incorporated in an interconnect interface having the generalized characteristics illustrated in FIG. 1. The interconnect interface is exemplified by a test socket 20 which includes a retainer plate 22 that holds and positions a unit under connection (UUC) 24. The UUC 24 may be a semiconductor or integrated circuit chip (illustrated), a package or device, a printed circuit board, electronic components or other electrical or electronic products (none shown). Each UUC 24 will have contact pads 26, or other contact surfaces or terminals, located on it by which to receive electrical power, electrical reference potential and input signals to the UUC and from which to deliver output signals from the UUC in response to the input signals.

Twist pins 28 are an important part of the interconnect interface exemplified by the test socket 20. The twist pins 28 conduct the input signals to the contact pads 26 of the UUC 24 and receive the output signals from the contact pads 26. In addition, the twist pins 28 may also conduct electrical power and reference potential to contact pads 26 of the UCC 24. The twist pins 28 are conventional, and details concerning them are described in U.S. Pat. Nos. 5,014,419; 5,054,192; 5,112,232; 6,584,677; 6,729,026 and 6,971,415, among others.

Each twist pin 28 is located in a conventional plated through hole or via 30 formed in a support plate 32 or other support structure. The vias 30 are located at predetermined positions on the support plate 32 which correspond to and align with the positions of the contact pads 26 on the UUC 24. When the retainer plate 22 moves the UUC 24 into aligned adjacency with the support plate 32, the corresponding alignment of the vias 30 with the contact pads 26 assures that ends of the twist pins 28 in the vias 30 will register with and contact the contact pads 26.

Figure 2A:
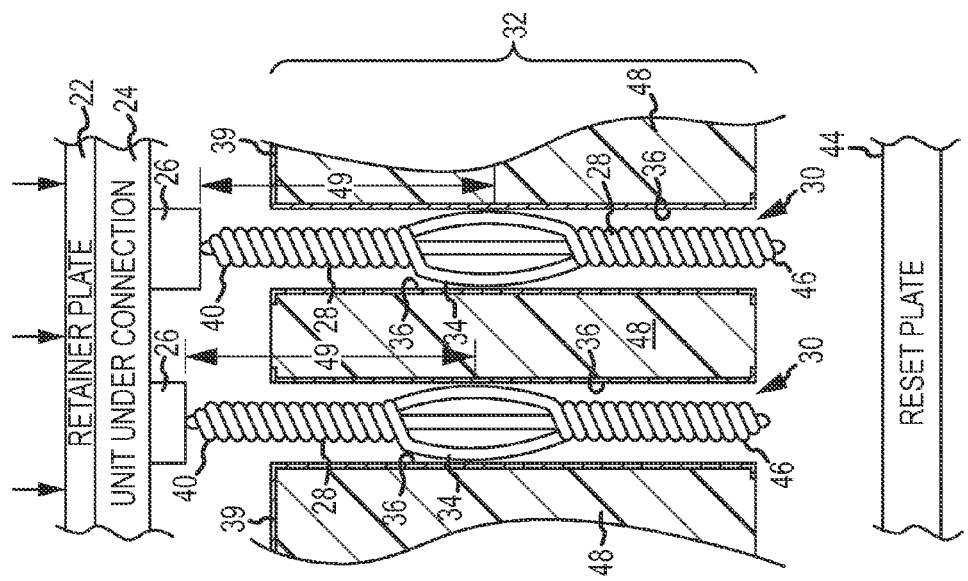
FIGS. 2A, 2B, 2C and 2D are enlarged vertical section and elevation views of portions of the interconnect interface or test socket shown in FIG. 1, taken substantially in a plane defined by lines 2-2 in FIG. 1, showing twist pins which occupy vias interacting with contact pads of the semiconductor chip.

As shown in FIG. 2A, each twist pin 28 includes at least one bulge 34. When the twist pin 28 is inserted in the via 30, the bulge 34 is slightly compressed in a radial direction relative to a longitudinal axis 35 through the twist pin 28. The radial compression of the bulge 34 establishes frictional contact of the bulge 34 with a sidewall 36 of the via 30. The sidewall 36 is an integral part of the via 30. The amount of frictional contact of the bulge 34 with the sidewall 36 is established by the amount of compression of the bulge against the sidewall 36. The amount of frictional contact is sufficient to hold the twist pin 28 in position in the via 30, but not so much as to prevent longitudinal movement of the twist pin in the via in response to forces applied to ends of the twist pin. The amount of compression of the bulge 34 creates the desired degree of resistance to longitudinal movement of the twist pin 28 in the via.

The electrical power, reference potential and input signals to the UUC 24 are supplied from a conventional signal generator and analyzer 38 or other test equipment, as shown in FIG. 1. The signal generator and analyzer 38 is connected to the sidewalls 36 of the vias 30 through conventional traces 39 (FIGS. 2A-4B; also 69, FIGS. 5A-5C and FIGS. 6A-6D) or other conventional conductors (78, FIG. 6A; and 92, 94, 96, FIG. 6D), formed in or on the support plate 32.

Figure 2B:
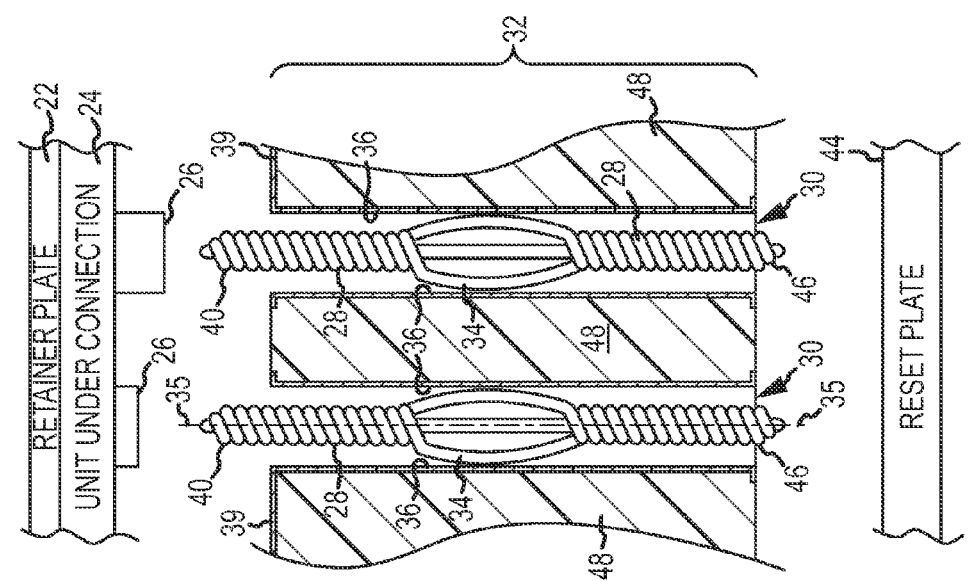

Downward movement of the retainer plate 22 along alignment guides 42 (FIG. 1) moves the UUC 24 until its contact pads 26 make mechanical and electrical contact with upper ends 40 of the twist pins 28 retained in the aligned corresponding vias 30, as shown in FIG. 2B. Each of the twist pins 28 moves downward in its via 30 an individual and specific amount to accommodate the relative height of the contact pad 26 which contacts each upper end 40, in response to the downward movement of the retainer plate 22 and the UUC 24. In this manner and because of the frictional resistance of the compressed bulge 34 against the sidewall 36, each of the twist pins makes and maintains firm electrical contact with each contact pad 26 to achieve a good signal communication pathway therebetween.

After achieving the electrical and mechanical contact, electrical power, reference potential and input signals from the signal generator and analyzer 38 are delivered to the UUC 24. Input or stimulus signals from the signal generator and analyzer 38 are transferred from the sidewall 36 of the via 30 into the individual strands of the twist pin as a result of the bulge 34 contacting the sidewall 36. The twist pin 28 transfers the signals to the upper end 40 of each twist pin 28. The upper end 40 of each twist pin transfers the input signals to the contacted contact pad 26, and input signals enter the UUC 24 from the contact pad 26. The UUC 24 responds to the input signals and creates output or response signals which are conducted from output signal contact pads 26. The output signals enter the upper end 40 of other twist pins 28 and are conducted from its bulges 34 to the sidewall 36 of the via 30 and through the conventional traces 39 or other conductors formed in or on the support plate 32 to the signal generator and analyzer 38. The signal generator and analyzer 38 performs elaborate and sophisticated analysis of both the input and output signals and their relationship to one another to determine whether the UUC 24 is properly functional.

Figure 2C:
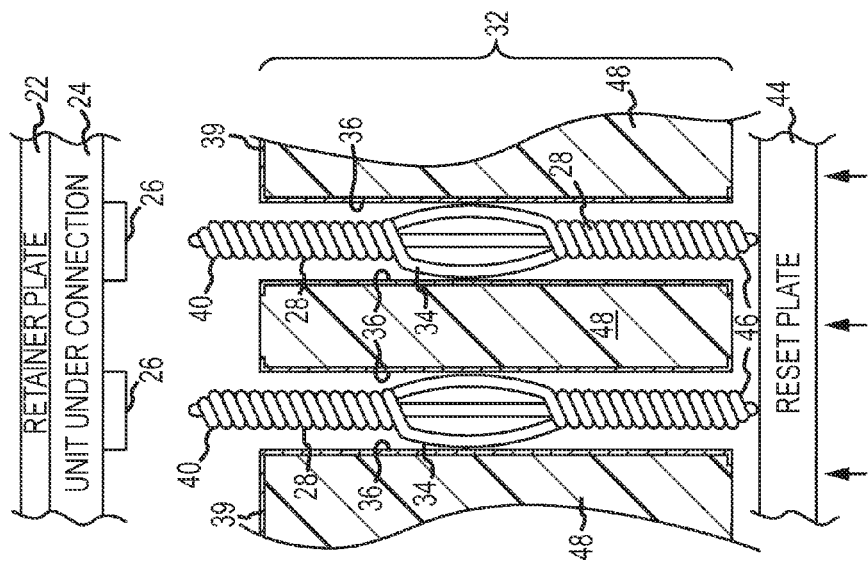

After the UUC has been tested, the retainer plate 22 withdraws the UCC 24 from the support plate 32 and separates the contact pads 26 from the upper ends 40 of the twist pins 28, as shown in FIG. 2C. Thereafter, a reset plate 44 moves upward along the alignment guides 42 (FIG. 1) and contacts lower ends 46 of the twist pins 28. The upward movement of the reset plate 44 pushes all of the twist pins 28 upward in their vias to approximately the same relative elevation to establish an initial position shown in FIG. 2D. The frictional contact of the compressed bulges with the sidewalls of the vias allow the twist pins 28 to move in response to the upward movement of the reset plate 44 and to remain in the position where they are moved.

Figure 2D:
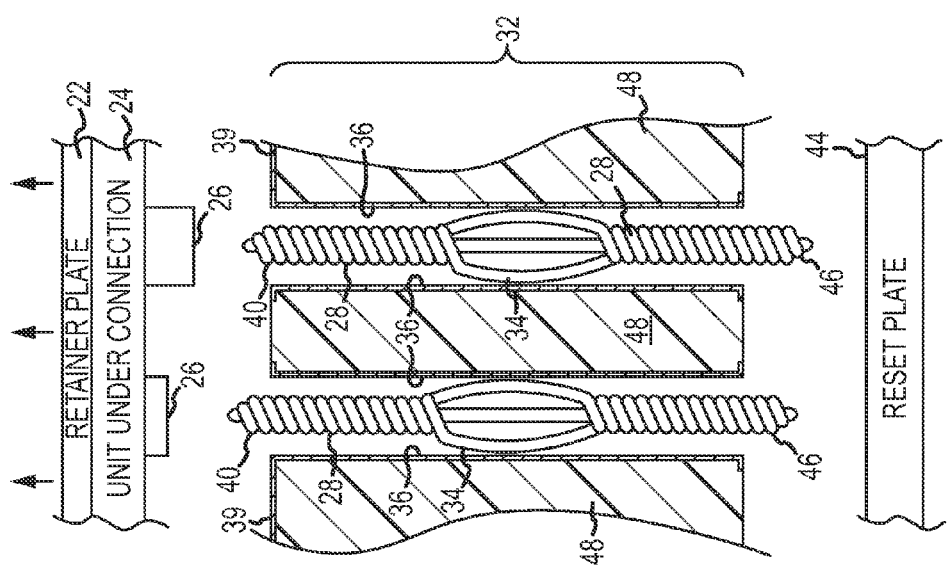

With the twist pins in the upward initial position shown in FIG. 2D, the twist pins 28 are ready for contact of their upper ends 40 with the contact pads 26 of the next UUC 24 to undergo testing at the commencement of the next UUC test cycle, illustrated at FIG. 2A. Of course, the previously-tested UUC 24 is removed from the retainer plate 22 using conventional techniques and another untested UUC 24 is connected to the retainer plate 22 before the next test is conducted in the same manner.

The movement of the retainer plate 22 and the reset plate 44 relative to the support plate 32 is achieved by conventional devices not shown. The support plate 32 may be a support structure formed by one or more printed circuit boards. The vias 30 are formed in a conventional printed circuit board manner in a dielectric substrate 48. The traces 39 are formed on the dielectric substrate 48 in the same manner that traces are formed on printed circuit boards. The support plate 32 may be formed by multiple printed circuit boards or as multiple dielectric substrate layers (not individually shown), with the traces 39 located on or between the dielectric layers. Each UUC 24 has substantially the same size and configuration of contact pads 26, so that each UUC is retained at the retainer plate 22 in essentially the same position. The contact pads 26 are also located in the same position on each UUC 24. The same sizes and positioning configurations enable the UUCs 24 of the same type to be tested continuously one after another, using the same support plate 32 with its vias 30 and twist pins 28. To test different types of UUCs, a different support plate 32 is used. The different support plate 32 has different locations for the vias 30 so that the twist pins 28 in those vias 30 align and register with the different positions of the contact pads 26 of the different UUCs 24.

The significant improvements available from use of the twist pins 28 in the interconnect interface exemplified by the test socket 20, and the advantageous characteristics which give rise to these improvements, are explained below in greater detail.

The use of the twist pins 28 results in a consistent, uniform and predictable distribution of force on the contact pads 26 of the UUCs 24. The bulge 34 of each twist pin 28 presses radially against the sidewall 36 of the via 30 in which the twist pin 28 resides. This mechanical pressure creates frictional resistance to the vertical movement of the twist pins 28 within the vias 30. The frictional resistance to movement of the twist pins 28 is substantially constant, regardless of the distance that the twist pin 28 moves in the via 30, because the amount of radial compression of each bulge 34 against the constant-diameter sidewall 36 is substantially constant and is approximately equal among all of the twist pins. The constant frictional resistance results in a constant force applied to the contact pads 26 by the upper ends 40 of the twist pins 28, when the downward movement (as shown) of the UUC pushes the twist pins downward in the vias with the upper ends 40 of the twist pins 28 in contact with the contact pads 26. Since the force on each contact pad 26 is predictable and uniform, the contact force from the twist pins on the contact pads is evenly distributed across the UUC 24, resulting in less chance of fracturing the UUC 24 from uneven force gradients. Prior art spring probes apply unequal forces on the contact pads 26 of the UUC 24 due to the non-coplanar relationship of the contact pads and differences in the compressed length of the spring interconnects. Such unequal force gradients increase the risk of fracturing the UUCs during testing.

The twist pins 28 have similar and substantially constant impedance characteristics. The similar and constant impedance characteristics create similar phase effects on the high frequency input and output signals that are conducted by the twist pins. Variations in impedance of an interconnect, such as the variation in length and impedance of a spring probe, introduces unknown and arbitrary phase relationships among the input and output signals. Variable and changed phase relationships between the input and output signals may cause the signal generator and analyzer 38 (FIG. 1) to reject a properly functioning UUC as having improper functionality, when in reality the problem arose from changed phase relationships created by the interconnects. The similar and constant impedance effects of the twist pins 28 therefore achieve more reliable test results.

The impedance of each twist pin 28 is generally related to the length of the effective signal path conducted through that twist pin. The length of the signal path through each twist pin 28 is generally the length between the location where the bulge 34 contacts the sidewall 36 and the point where the upper end 40 contacts the contact pad 26. This length is illustrated by the dimensions represented by the dimensional arrows 49 shown in FIG. 2B. As is shown in FIG. 2B, the length of the signal path in the twist pins 28 is identical, even though the relative levels of the contact pads 26 are different and the relative position of the twist pins 28 in the vias 30 is different. The identical length signal paths through the twist pins results because the bulges 34 move along the sidewalls 36 to accommodate the different relative levels of the contact pads 26, but the length between the location where the compressed bulge contacts the sidewall and the end of the twist pin remains essentially constant despite this movement. The similar mechanical and electrical characteristics and effective lengths of the twist pins avoid the introduction of signal phase discrepancies.

The twist pins 28 present a greater surface area for conducting high-frequency signals compared to a typical spring probe. The greater surface area results in better quality high frequency signals. High-frequency signals tend to be conducted on the exterior surface of a conductor. A relatively large exterior surface of the conductor results in less attenuation of the high-frequency signals. The twist pin 28 presents a substantial surface area for conducting high-frequency signals because the individual strands of the twist pin have their own surfaces upon which to conduct the high frequency signal. Furthermore, all the strands which form the bulge 34 individually contact the sidewalls 36 of the via 30, thereby increasing the surface contact area for transferring high-frequency signals from the sidewall 36 of the via 30 to each twist pin 28. In some types of twist pins formed from helically coiled strands which surround a center strand, the center strand may remain in the center of the bulge and therefore not contact the sidewall of the via. The type of twist pin having a center strand in the center of the bulge is known in the art.

The twist pins 28 are manufactured more economically compared to spring probes, because the spring probes are generally formed with very small, intricate and unique configurations of parts that require considerable attention during assembly and manufacturing. In contrast, the twist pins 28 may be mass produced from stranded wire in a single cost-effective procedure which requires no assembly of component parts, while still retaining similar characteristics among all of the twist pins, as discussed in the US patents identified above.

Each twist pin 28 generally has a transverse dimension across its bulge 34 which is generally comparable in size to the contact pad 26 or is smaller in transverse size than the contact pad 26. Consequently, each of the twist pins 28 occupies no more space than the space occupied by the contact pad 26. The small transverse dimension of the twist pins 28 allows them to make electrical interconnections with the contact pads 26 at approximately the same pitch, density or spacing as the contact pads. Adequate space is available at the support plate 32 to accommodate the vias 30 and the traces 39 or other conductors which conduct the signals to and from the vias 30, even when the vias 30 have a relatively close pitch or spacing and a high density. The vias 30, traces and conductors formed using printed circuit board techniques do not limit the ability to conduct signals to the twist pins 28, or to achieve a high density and close pitch of vias 30 containing twist pins 28, unlike more space-consumptive techniques used to supply the signals to spring probes and other types of interconnectors.

Figure 3A:
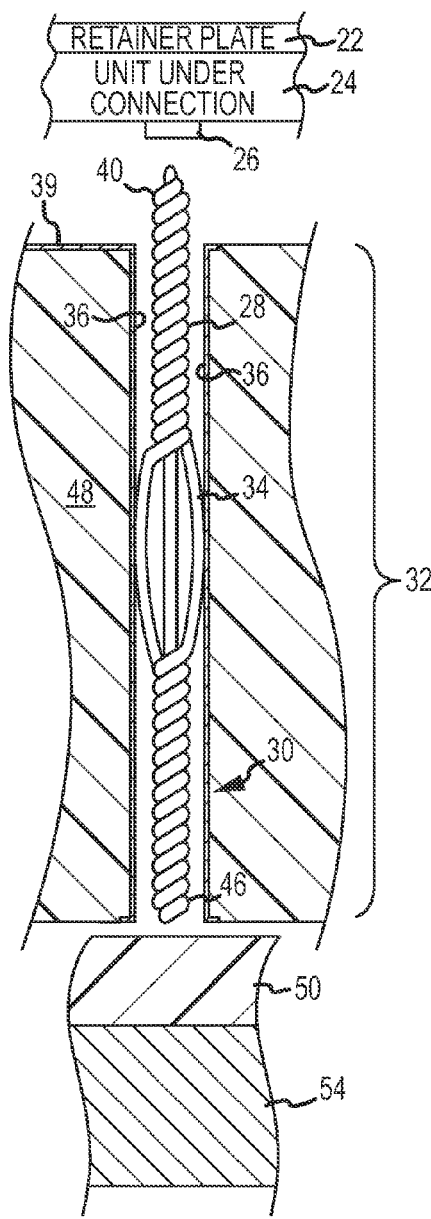
FIGS. 3A and 3B are vertical section and elevation views which are similar to FIGS. 2A-2D, showing a variation of the interconnect interface or test socket shown in FIG. 1, which employs an elastomer.
Figure 3B:
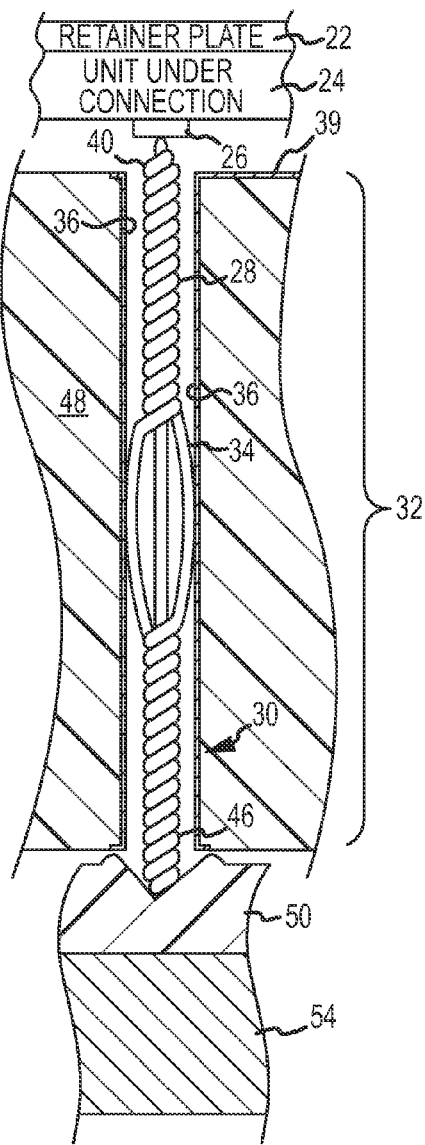

Another variation of the interconnect interface uses a deformable non-conductive elastomer layer 50 supported on a rigid base plate 54, as shown in FIGS. 3A and 3B. An elastomer layer 50 is used below the twist pin 28 instead of the more rigid reset plate 44 (FIGS. 2A-2D). The elastomer layer 50 is used to maintain a continual upward force (as shown) on the twist pin, thereby maintaining its upper end 40 in continuous firm contact with the contact pad 26. The embodiment shown in FIGS. 3A and 3B is suited for permanently docking or connecting the UUC 24, although the embodiment could also be used in testing the UUC.

The twist pin 28 is shown in an initial position in FIG. 3A, in the via 30. After the contact pad 26 of the UUC 24 contacts the upper end 40 of the twist pin 28, continued downward movement of the UUC 24 (as shown), or continued upward movement of the base plate 54 (as shown), results in the lower end 46 of the twist pin 28 depressing the elastomer layer 50, as shown in FIG. 3B. A gap between the elastomer layer 50 and the bottom of the support plate 32 allows room for the elastomer layer 50 to displace around the lower end 46 of the twist pin 28, when the twist pin 28 depresses the elastomer layer 50. The depression of the elastomer layer 50 creates an upper force (as shown) on the twist pin 28, and that upward force is transferred through the twist pin to maintain the upper end 40 in firm electrical contact with the contact pad 26. The upward force from the elastomer layer 50 is slightly greater than the frictional force created by the compressed bulge 34 on the sidewall 36, thereby supplementing the contact force of the end of the twist pin with the contact pad. However, the force created by depressing the resilient elastomer layer is more independent of the amount of depression than is the amount of additional force created by the travel of a prior art spring probe. The base plate 54 stays in position to maintain a continual upper force (as shown) on the twist pin 28.

The elastomer layer 50 transfers continual force to the twist pin to maintain a good electrical connection. Such a connection is particularly useful for docking a UUC where vibration and other natural movement of the electronic product may have the tendency to overcome the frictional resistance of the compressed bulge 34 against the sidewall 36 and separate the contact end 40 of the twist pin from the contact pad 26. The continual force from the depressed elastomer layer 50 avoids such separation. For this reason, the embodiment shown in FIGS. 3A and 3B is well-suited for the permanent docking of a UCC. However, the elastomer layer 50 can also be used in a test socket, because the force created by depressing the layer 50 will supplement the frictional force created by the compressed bulge against the sidewall, thereby allowing the upward force from the depressed elastomer layer 50 to return the twist pins to an initial position (FIG. 3A) after the UUC 24 is moved away from the support plate 32. The durometer of the elastomer layer 50 adjacent to the lower ends 46 of the twist pins is selected to prevent each lower ends 46 from penetrating into the elastomer layer 50. Alternatively, a flexible reinforcement layer or pad which resists penetration may be incorporated on or near the surface of the elastomer layer 50 to prevent penetration by the lower ends 46 of the twist pins. Returning the twist pins to their initial positions due to the resiliency of the elastomer layer 50 and without the requirement to move a reset plate (FIG. 2D) is advantageous when testing UUCs.

The UUC can be docked in an economical and permanent manner without the use of solder connections, for example by using the embodiment described in FIGS. 3A and 3B. Avoiding the use of solder, particularly lead-free solder, can be an advantage in connecting a UUC. Fewer assembly steps are required, because the solder does not have to be melted to establish the connection. Lead-free solder has a tendency to deteriorate over time, causing the quality of the electrical connection to decrease and possibly leading to the failure of the electronic product. Lead-free solder also has a tendency to grow or evolve whiskers over time, and those whiskers may create undesirable circuit paths and short circuits that prevent proper operation of the UUC.

The arrangement shown in FIGS. 3A-3B can also be used in a testing process for a UUC, with the elastomer layer 50 and base plate 54 replacing the reset plate 44 of FIGS. 2A-2D). However, in such circumstances, the elastomer layer 50 induces an upward force which is transferred through each twist pin, and that upward force is generally related to the amount of depression of the lower end 46 into the elastomer layer 50. In such an arrangement, uniform force on all of the contact pads 26 from the upward ends 40 of the twist pins 28 may not be possible, although the force created by depressing the resilient elastomer layer is more independent of the amount of depression than is the amount of additional force created by the travel of a prior art spring probe.

Figure 4A:
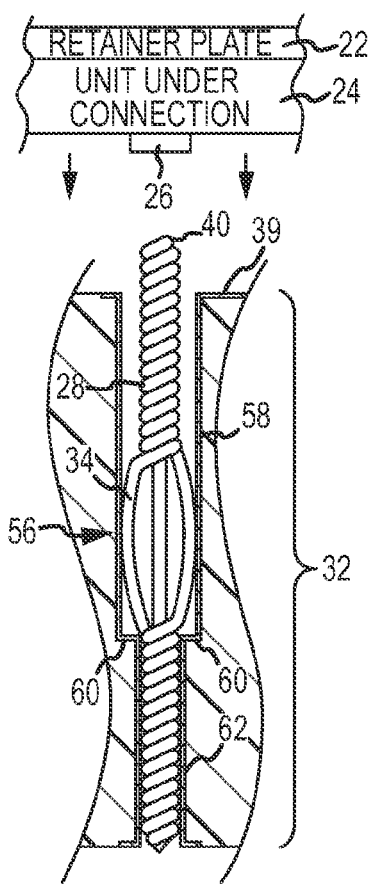
FIGS. 4A and 4B are vertical section and elevation views which are similar to FIGS. 2A-2D and FIGS. 3A-3B, showing another variation of the interconnect interface or test socket shown in FIG. 1, which employs a via that has two different diameters to retain and interact with a twist pin.
Figure 4B:
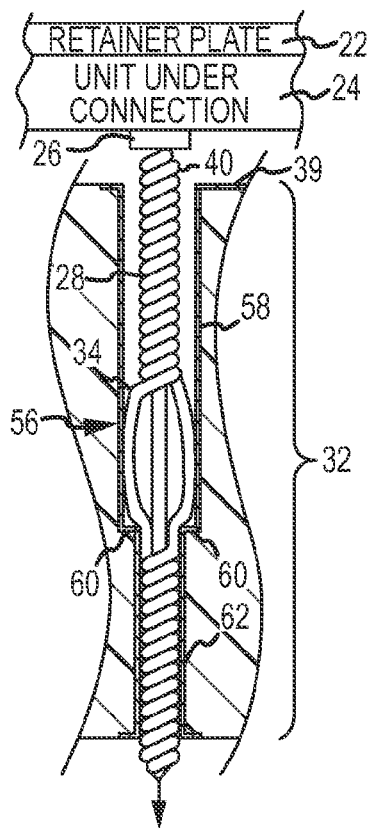

Using twist pins 28 in a double diameter via 56, as shown in FIGS. 4A and 4B, achieves additional contact force between the contact end 40 of the twist pin 28 and the contact pad 26 and also helps to return the twist pin 28 toward the initial position. The double diameter via 56 is used in place of the uniform diameter via 30 (FIGS. 2A-2D and 3A-3B). The via 56 has an upper (as shown) greater diameter portion 58, a lower (as shown) lesser diameter portion 62, and a shoulder portion 60 which separates the greater and lesser diameter portions 58 and 62. The metallic sidewall extends over the greater and lesser diameter portions 58 and 62 and over the shoulder portion 60. In the initial position shown in FIG. 4A, radially outward and upward (as shown) anti-helically twisted strands which transition into the bulge 34 of the twist pin 28 make little or no contact with the shoulder portion 60 between the different diameter portions 58 and 62. In this initial position, the forces acting on the twist pin 28 are substantially only from the compression of the bulge 34 against the sidewall of the larger diameter portion 58.

When the contact pad 26 of the UUC 24 contacts and moves the twist pin 28 downward in the via 56, the radially outward and upward (as shown) strands which transition into the bulge 34 are forced into the shoulder portion 60. Those strands are deformed radially inward and slightly compressed by contact with the inner edge of the shoulder portion 60 due to downward movement of the twist pin 28, as shown in FIG. 4B. This deformation creates an upward force on the twist pin 28 which helps push the upper end 40 of the twist pin 28 against the contact pad 26 and ensures a good electrical connection.

The arrangement shown in FIGS. 4A and 4B introduces an upward force on the contact pads 26 in relation to the amount of longitudinal downward movement of the twist pin 28. In such an arrangement, constant force on the variable height contact pads 26 from the upward ends 40 of the twist pins 28 may not be possible, although other advantages and improvements of using the twist pins as interconnect interfaces are achieved. The upward force resulting from deformation of strands by contact with the inner edge of the shoulder portion 60 returns or assists in returning the twist pins to the initial position (FIG. 4A) after the UUC 24 is moved away from the support plate 32. Returning the twist pins to their initial positions without the requirement to move a reset plate (FIG. 2D) is advantageous when testing UUCs. The arrangement shown in FIGS. 4A and 4B may be advantageously employed in permanently docking UUCs which are not fragile, such as some types of semiconductor chips, and packages, devices, printed circuit boards or electronic products.

Another variation of the interconnect interface retains the twist pins 28 in a non-conductive elastomer support plate 64 which does not utilize vias, is shown in FIGS. 5A, 5B and 5C. The elastomer support plate 64 is formed in two layers 64*a* and 64*b*. Apertures 65 are formed in each layer 64*a* and 64*b*, and each aperture 65 is defined by a lesser diameter portion 65*a* and a greater diameter portion 65*b*. The two layers 64*a* and 64*b* are retained together with the greater diameter portions 65*b* adjoining one another, after a twist pin has been inserted into the portions 65*a* and 65*b* of both layers 64*a* and 64*b*, as shown. The greater diameter portions 65*b* surround the bulge 34 in the twist pin 28 and provide space for the bulge to flex, while the lesser diameter portions 65*a* hold the upper and lower ends 40 and 46 of the twist pin 28 in the desired position. The two layers 64*a* and 64*b* are then connected together, thereby forming the elastomer support plate 64.

Each twist pin 28 conducts electrical signals between a contact pad 66 of a circuit board 68 which contacts the lower end 46 of the twist pin 28 and a contact pad 26 of a UUC 24 which contacts the upper end 40 of the twist pin. The elastomer material of the support plate 64 is sufficiently resilient around the aperture 65 to allow the twist pin 28 to bend or flex slightly in response to a compressive force acting on opposite ends 40 and 46 of the twist pin 28 from contact with the contact pads 66 and 26, as shown in an exaggerated form in FIG. 5B. In general, the twist pin 28 is likely to flex or bend in the area of the bulge 34 surrounded by the larger diameter portions 65*b* of the aperture 65. The lesser diameter portions 65*a* of the apertures 65 are effective in maintaining the ends 40 and 46 of the twist pin 28 in contact with the contact pads 26 and 66, and prevent them from displacing laterally to the side of the contact pads 26 and 66 even though the twist pin may flex or bend. The thickness of the elastomer support plate 64 can be varied in relation to the length of the twist pins 28 so that the ends of the twist pin 28 extend from the elastomer 64 only to a desired length.

In use, the elastomeric support plate 64 is inserted between the UUC 24 and the circuit board 68 with the ends 40 and 46 of the twist pins 28 in alignment with the contact pads 26 and 66, respectively. Relative movement between the UUC 24 and the circuit board 68 occurs, causing the ends 40 and 46 of the twist pins 28 to register with and contact the contact pads 26 and 66. Traces 69 conduct power, reference potential and input signals to the contact pads 66 of the circuit board 68. The twist pins 28 conduct the power, reference potential and input signals to the contact pads 26 of the UUC 24. The UUC 24 responds to the input signals and supplies output signals on its contact pads 26, which are conducted through the twist pins 28 to the contact pads 66 of the circuit board 68. Other traces 69 conduct the output signals from the contact pads 66. The signal generator and analyzer 38 (FIG. 1) is connected to the traces 69 on the circuit board 68, by which to supply the input signals and analyze the responsive output signals and thereby determine the functionality of the UUC 24.

Under circumstances where the elastomer support plate 64 is very flexible, the contact pads 66 and 26 may be replaced with recessed contact areas 70 and 72, shown in FIG. 5C. The recessed contact areas 70 and 72 capture the ends 40 and 46 of the twist pin 28, respectively, and prevent the ends 40 and 46 from inadvertently moving out of electrical contact with the recessed contact areas 70 and 72.

The interconnect interface shown in FIGS. 5A, 5B and 5C can be used both for testing a UUC 24 and for docking the UUC 24 to the circuit board 68. The interconnect interface shown in FIGS. 5A, 5B and 5C does not require the formation of vias, conductors or traces on or in the elastomeric support plate 64.

Figure 6A:
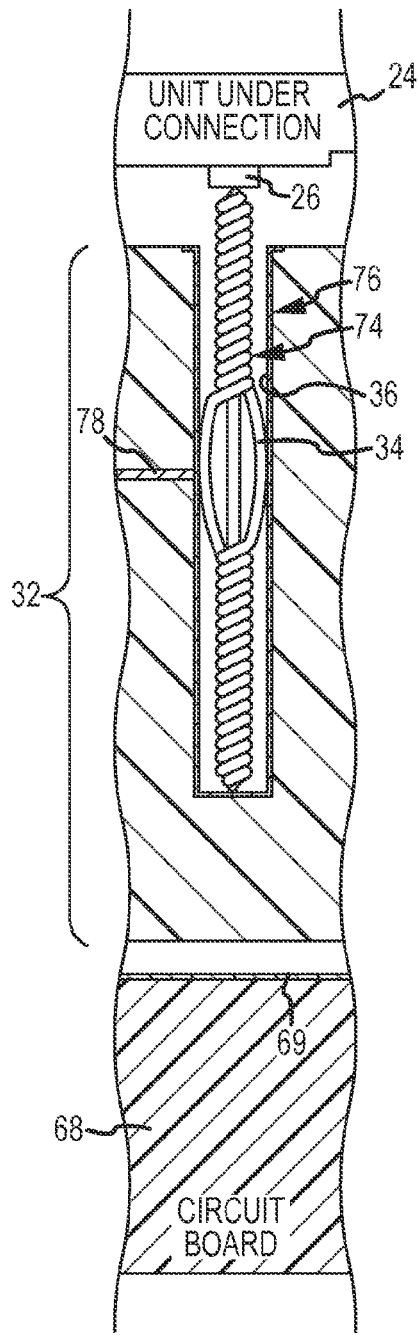
FIGS. 6A, 6B, 6C and 6D are vertical section and elevation views similar to FIGS. 2A-2D, FIGS. 3A-3B, FIGS. 4A-4B and FIGS. 5A-5C, showing a variety of different connection arrangements for twist pins and vias to communicate electrical power, electrical reference potential, input signals and output response signals.

Electrical power, reference potential, input signals and output signals can be conducted to and from the UUC 24 by using a support plate 32 and a circuit board 68, as shown in FIG. 6A. A single bulge twist pin 74 is located in a closed bottom or blind via 76 which is located in the support plate 32. As discussed above, the support plate 32 may be constructed from one or more conventional printed circuit boards, and the blind via 76 is also constructed in a conventional manner. An internal trace 78 is located within the support plate 32. The internal trace 78 is constructed by forming conventional trace on one printed circuit board and then laminating another printed circuit board to the first printed circuit board, or using other conventional techniques. The internal trace 78 intersects the sidewall 36 of the blind via 76. Electrical power, reference potential, input signals or output signals are conducted on the internal trace 78 by which to establish signal conduction through the bulge of the twist pin 78 to the contact pad 26 of the UUC 24.

Figure 6B:
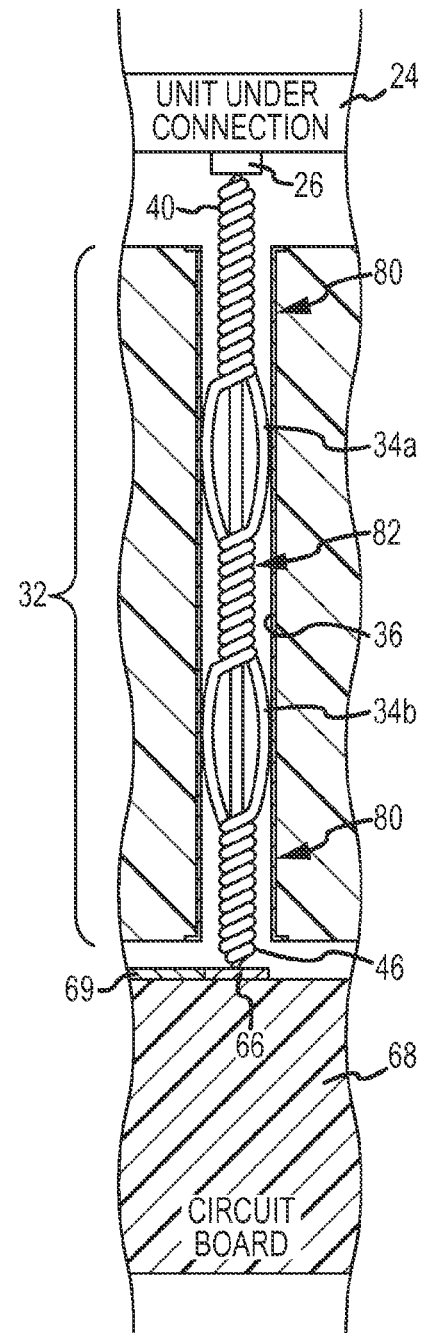

Another variation employs a pass through via 80 which extends completely through the support plate 32, as shown in FIG. 6B. The via 80 is not electrically connected to any trace associated with the support plate 32. Instead, a double bulge twist pin 82 is located within the via 80. The twist pin 82 conducts power or signals from the contact pad 66 of the circuit board 68 to the contact pad 26 of the UUC 24. The upper end 40 of the twist pin 82 contacts the contact pad 26, and the lower end 46 of the twist pin 82 contacts the contact pads 66 of the circuit board 68. When the twist pin 82 conducts the power or electrical signal, the sidewall 36 of the pass through via 80 is in electrical contact with the bulges 34*a* and 34*b* of the twist pin 82, but the signal or power is confined for conduction through the twist pin 82 because the via 80 is not electrically connected by a trace to any other component. The sidewall 36 mechanically confines the twist pin 82 to the pass through via 80. The bulges 34*a* and 34*b* are both slightly compressed against the sidewall 36 to both and move along the sidewall 36. The mechanical contact of both bulges 34*a* and 34*b* with the sidewall 36 stabilizes the twist pin 82 against lateral tipping within the via 80. Multiple bulges on a single twist pin in a single via are useful for mechanically maintaining the alignment of the both ends 40 and 46 of the twist pins for registration with the contact pads.

Figure 6C:
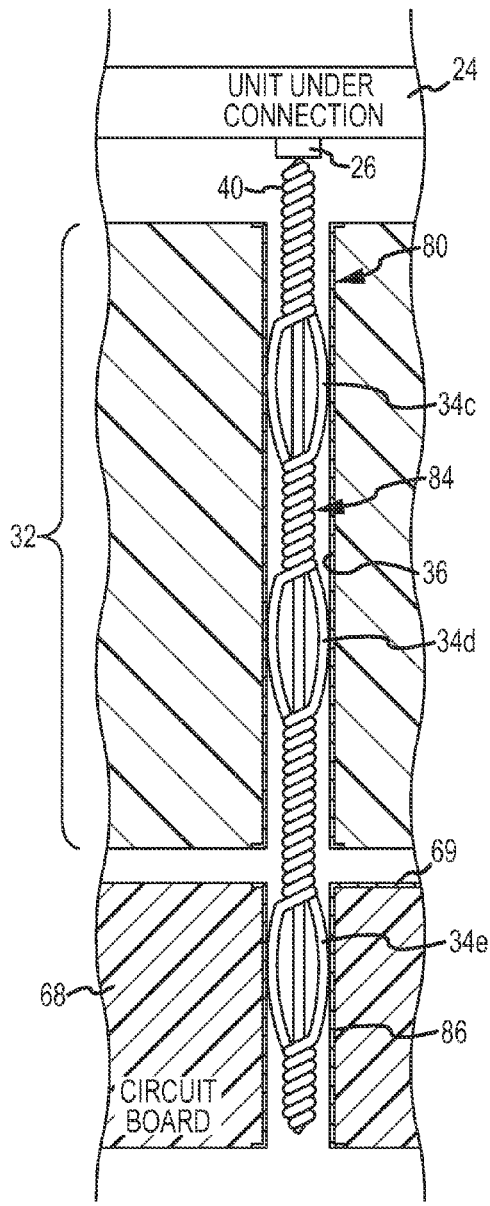

A further variation uses a pass through via 80 and a triple bulge twist pin 84, as shown in FIG. 6C. Bulges 34*c* and 34*d* of the twist pin 84 are located in compressive contact with the sidewall 36 of the through via 80 to stabilize the twist pin 84 against tipping, in a manner similar to that which stabilizes the twist pin 82 against tipping (FIG. 6B). A lower portion of the twist pin 84 extends downward (as shown) and includes a third bulge 34*e*. The third bulge 34*e* is located beyond the support plate 32 in via 86 formed in the circuit board 68. The via 86 is connected by a trace 69 of the circuit board 68 to a source of electrical power, electrical reference potential, and input signal or an output signal. The use of another via to contact one bulge of the twist pin in order to transfer signals to or from that twist pin is an alternative to contacting the end 46 of the twist pin with a contact pad 66. The use of the bulge 34*e* and the via 86 to transfer signals to the twist pin is confined only to the circuit boards and other equipment which deliver the signals, since the UUC 24 must be connected at its contact pads 26. The via 86 could also be a blind via.

Figure 6D:
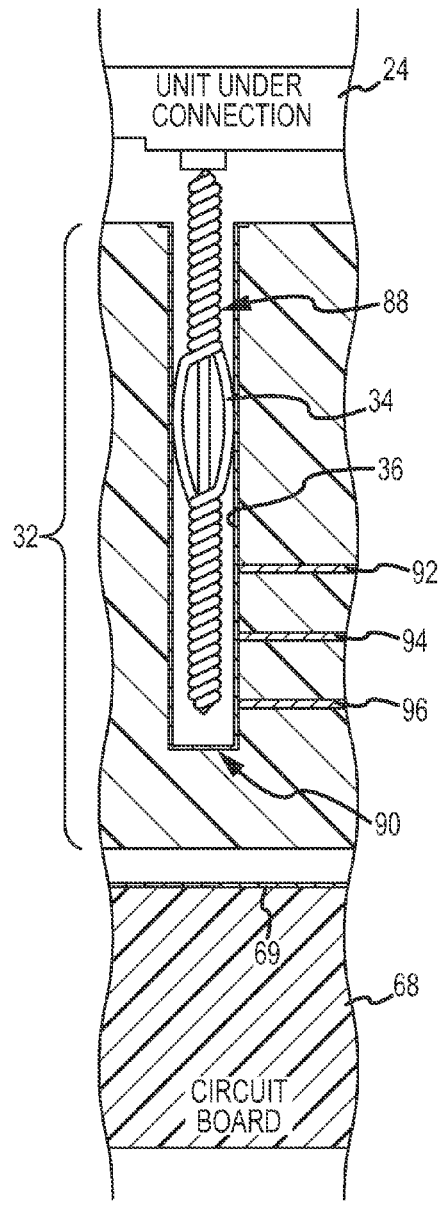

Another variation uses a twist pin 88 which resides in a blind via 90 that is connected by multiple internal traces 92, 94 and 96, as shown in FIG. 6D. The internal traces 92, 94 and 96 occupy different layers of the circuit board support plate 32. The traces 92, 94 and 96 electrically connect to the sidewall 36 of the blind via 90 at different locations relative to the point where the bulge 34 of the twist pin 88 contacts the sidewall 36. This configuration is useful in controlling high-frequency signal reflections and standing waves. By controlling the point at which the signals are introduced into or received from the via 90 in relation to the frequency of those signals, the physical influences which might create standing waves and signal reflections are minimized. Of course, minimizing standing waves and signal reflections enhances the quality and integrity of the signals conducted by the twist pin 88. The one of the traces 92, 94 or 96 which produces the best quality signal conducted to or received from the contact pad 26 may be determined through experimentation or by selection in accordance with the quality and frequency of the signal conducted.

Using multiple traces or conductors, e.g. 92, 94 and 96, at different positions along the vertical height of the sidewall of the via 90 also allows selection of the trace or conductor which most directly conducts signals to and from the bulge of the twist pin 34 in the via 90. The ability to select between multiple conductors or traces which are internal along the length of the via achieves a more uniform length signal path through the sidewall, into the via and from the end of the twist pin to the contact pad.

Figure 7A:
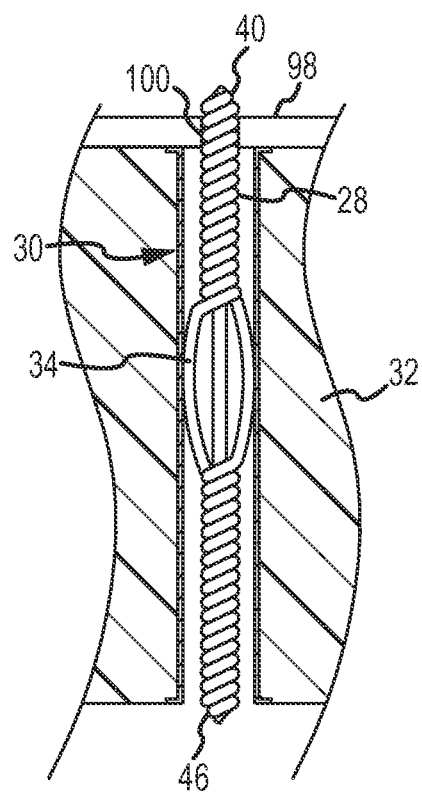
FIGS. 7A and 7B are vertical section and elevation views similar to FIGS. 2A-2D, FIGS. 3A-3B, FIGS. 4A-4B, FIGS. 5A-5C and FIGS. 6A-6D, showing different guides to maintain alignment of the twist pins.

In situations where stability against lateral tipping of the twist pin is required but the length of the twist pin can not accommodate multiple bulges, a single bulge twist pin 28 can be utilized in connection with a guide 98, as shown in FIG. 7A. The twist pin guide 98 is a planar structure formed from thin electrically insulating material with a center aperture 100 having a diameter slightly larger than the upper end 40 of the twist pin 28. The guide 98 is attached to the upper (as shown) side of the support plate 32 with the aperture 98 aligned with an axis of the via 30. The center aperture 100, being slightly larger than the upper end 40 of the twist pin 28 does not resist longitudinal movement of the upper end 40 of the twist pin, but the center aperture 100 is sufficiently close to the upper end 40 to prevent the twist pin 28 from tipping laterally within the via 30. Although one guide 98 is shown connected to the upper surface of the support plate 32, a similar guide can be connected in the same manner on the bottom surface of the support plate with its center aperture surrounding the lower end 46 of the twist pin 28. The use of guides at both ends of the twist pin provides further restraint against the twist pin tipping in the via and maintains the ends of the twist pin in alignment for registration with the contact pads.

Figure 7B:
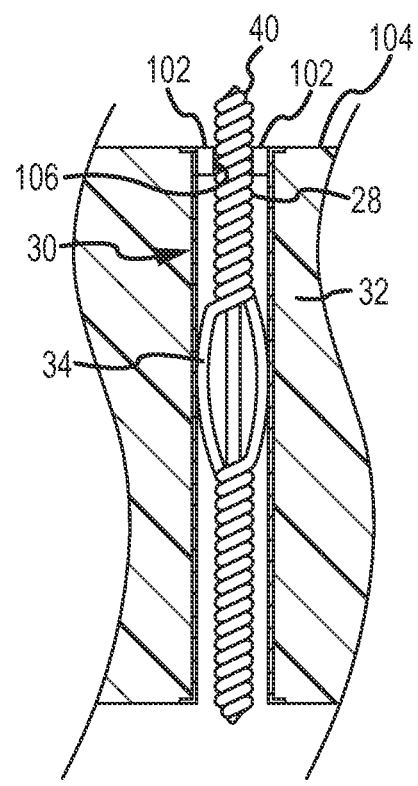

An alternative to the guide 98 is a ring guide 102 shown in FIG. 7B. The ring guide 102 is annularly shaped and is inserted in the upper (as shown) end of the via 30 to be near or flush with a surface 104 of the support plate 32. The ring guide 102 is secured into position within the via 30 with an adhesive or by a frictional press fit. A center aperture 106 in the ring guide 102 has a diameter which is slightly larger than the diameter of the upper end 40 of the twist pin 28, thereby allowing the upper portion of the twist pin to move freely and in axial direction while providing lateral support against tipping of the twist pin. A similar ring guide 102 can be inserted in the lower end of the via 30.

The uses of the twist pins and vias described above have significant advantages over prior art spring probes and similar interconnectors in test sockets and for permanently docking semiconductor or integrated circuit chips, packages or devices, printed circuit boards, electronic components or other electrical or electronic products. The significance of the improvements and advantages of the present invention will become apparent upon gaining a full appreciation of the ramifications of the present invention. Preferred embodiments of the invention and many of its improvements have been described above with a degree of particularity. The detail of the above description is not necessarily intended to limit the scope of the invention. The scope of the invention is defined by the following claims.

What is claimed:

1. Apparatus for conducting electrical signals to and from an electronic component having a plurality of contact pads, comprising:

a support plate containing a plurality of holes formed in alignment to register with the plurality of contact pads, each of the holes having a sidewall containing a sidewall conductor which conducts the electrical signals;

a plurality of twist pins, each twist pin residing in a separate hole, each twist pin formed by a plurality of helically coiled strands, each twist pin further including a bulge formed by an expansion of the strands at a location between opposite ends of the twist pin, the bulge of each twist pin contacting the sidewall conductor and contacting the sidewall with force caused by compression of the bulge against the sidewall; and wherein:

one end of each twist pin extends beyond the support plate at the hole in which the twist pin resides and physically contacts the aligned contact pad of the electronic component with contact force created by frictional compressive contact of the bulge against the sidewall;

each twist pin is movable along a portion of the sidewall to accommodate relative differences in height position of the contact pads of the electronic component; and each twist pin creates contact force between the end and the contact pad which is independent of the amount of movement of the bulge along the sidewall.

2. Apparatus as defined in claim 1, wherein:
the contact forces created by frictional compressive contact of the bulges against the sidewalls are approximately equal.

3. Apparatus as defined in claim 1, wherein:
the contact forces of each end of a plurality of the twist pins with the contact pads are approximately equal.

4. Apparatus as defined in claim 1, wherein:
each hole in the support plate is a via having a conductive sidewall;
the sidewall conductor is the conductive sidewall of the via;
each bulge is compressed into mechanical contact with the conductive sidewall of each via;
the bulge electrically transfers the electrical signals between the twist pin and the conductive sidewall of the via; and
the end of the twist pin transfers the electrical signals between the twist pin and the contact pad of the electronic component.

5. Apparatus as defined in claim 4, wherein:
the support plate comprises a printed circuit board;
each via is formed in the printed circuit board; and
an electrical conductor of the printed circuit board conducts the signals to and from the via.

6. Apparatus as defined in claim 5, wherein:
the electrical conductor of the printed circuit board connects to the via at a location within the circuit board.

7. Apparatus as defined in claim 4, wherein:
each twist pin includes multiple bulges formed along its length between its opposite ends; and
each bulge of the multiple bulged twist pin contacts the conductive sidewall of the via to maintain the ends of the twist pin at fixed predetermined positions relative to the via.

8. Apparatus as defined in claim 4, wherein:
the via includes one larger diameter portion extending from the support plate into the hole in one direction and other smaller diameter portion extending from the support plate into the hole in the opposite direction, and a transition portion between the larger and smaller diameter portions; and
the bulge of the twist pin also longitudinally contacts the transition portion.

9. Apparatus as defined in claim 8, wherein:
longitudinal movement of the twist pin within the via to contact one end of the twist pin with the contact pad longitudinally compresses the bulge against the transition portion to induce longitudinal force on the twist pin in opposition to the direction of longitudinal movement of the twist pin.

10. Apparatus as defined in claim 4, further comprising:
a guide member connected to the support plate and having an aperture surrounding the end of at least one of the plurality of twist pins to align the end of the twist pin with the via, the aperture in the guide member supporting the end of the twist pin to resist tilting in the via.

11. Apparatus as defined in claim 10, wherein:
the guide member includes a nonconducting guide plate connected to the support plate to align each aperture with a via in the support plate.

12. Apparatus as defined in claim 10, wherein:
the guide member includes ring shaped annular structure positioned inside the via.

13. Apparatus as defined in claim 4, wherein:
the vias extend through the support plate;
each twist pin has a length which extends its opposite first and second ends from the via on respectively opposite positions of the support plate; and further comprising:
a retainer plate for retaining the electronic component with the contact pads in contact with the first ends of the twist pins projecting from the vias on one side of the support plate.

14. Apparatus as defined in claim 13, wherein:
the movement of the retainer plate also moves the twist pins longitudinally within the vias while establishing contact of the first ends of the twist pins with their aligned contact pads.

15. Apparatus as defined in claim 14, used for mass testing of integrated circuits, wherein:
each electronic component constitutes an integrated circuit;
the retainer plate moves the integrated circuit away from the support plate after a test has been conducted on the integrated circuit to separate the contact pads from contact with the first ends of the twist pins; and further comprising:
a reset plate located on the opposite side of the support plate from the retainer plate, the reset plate contacting the second ends of the twist pins projecting from the support plate and moving the twist pins longitudinally in the vias after the retainer plate has separated the contact pads of the integrated circuit from contact with the first ends of the twist pins.

16. Apparatus as defined in claim 14, used as a docking connection for the electronic components, further comprising:
a base plate located on the opposite side of the support plate from the retainer plate, the base plate including an elastomeric layer which interacts with the second ends of the twist pins to induce longitudinal force through the twist pins for maintaining the first ends of the twist pins in contact with the aligned contact pads.

17. Apparatus as defined in claim 16, wherein:
the base plate includes an elastomeric layer which resiliently contacts the second ends of the twist pins by deflection of the elastomeric layer to induce the longitudinal force through the twist pin for maintaining the first ends of the twist pins in contact with the aligned contact pads.

18. Apparatus for conducting electrical signals between an electronic component having a plurality of contact pads and a circuit component having a plurality of contact areas located in aligned relationship with the plurality of contact pads, comprising:
a support plate containing a plurality of holes formed in alignment to register with the plurality of contact pads and the plurality of contact areas;
a plurality of twist pins, each twist pin residing in a separate hole, each twist pin formed by a plurality of helically coiled strands, each twist pin further including a bulge formed by an expansion of the strands at a middle portion of the twist pin between opposite first and second ends of the twist pin; and wherein:
the first and second ends of each twist pin extend from the support plate at opposite ends of the hole in which the twist pin resides;
the first end of each twist pin physically and electrically contacts contact the aligned contact pads of the electronic component;

the second end of each twist pin physically and electrically contacts contact the aligned contact areas of the circuit component;
the first and second ends respectively contacting the contact pads and contact areas with compressive force arising from compression of the bulge within the hole; and
each twist pin is movable along the hole to accommodate relative differences in height position of the contact pads of the electronic component.

19. Apparatus as defined in claim 18, wherein:
the support plate is formed of nonconductive elastomeric material; and
the bulge of each twist pin is embedded within the nonconductive elastomeric material of the support plate.

20. A method for conducting electrical signals to and from an electronic component having a plurality of contact pads, comprising:
using a plurality of twist pins, each twist pin comprising a plurality of helically coiled strands and a bulge formed by an expansion of the strands at a location between opposite ends of the twist pin;
retaining each twist pin in a hole formed in a support plate by compressively contacting each bulge with a sidewall of the hole;
aligning the holes in the support plate with the contact pads;
contacting a first end of the twist pin in each hole with the aligned contact pad;
contacting the end of the twist pin with the contact pad using contact force derived from frictional compressive contact of the bulge with the sidewall;
conducting electrical signals through the twist pins and the aligned contact pad while maintaining contact force between the contact pad and the first end of each twist pin; and
moving each twist pin along the sidewall to accommodate relative differences in height position of the contact pads.

21. A method of as defined in claim 20, further comprising:
creating approximately equal contact forces from each twist pin by approximately equal frictional compressive contact of the bulges against the sidewalls.

22. A method of as defined in claim 20, further comprising:
creating contact force between the first end of the twist pin and the contact pad which is independent of the amount of movement of the twist pin along the sidewall.

23. A method of as defined in claim 22, further comprising:
using holes in the support plate which each includes one larger diameter portion extending from the support plate into the hole in one direction and another smaller diameter portion extending from the support plate into the hole in the opposite direction and a transition portion between the larger and smaller diameter portions; and
contacting the bulge of the twist pin with the transition portion to longitudinally compress the bulge against the transition portion and induce longitudinal force on the twist pin in opposition to the direction of longitudinal movement of the twist pin.

24. A method of as defined in claim 20, further comprising:
using vias having conductive sidewalls as the holes in the support plate;
compressing the bulge of the twist pins into mechanical contact with the conductive sidewall of each via; and
conducting the electrical signals through the twist pin by electrically transferring the electrical signals between the twist pin and the conductive sidewall of the via.

25. A method of as defined in claim 20, further comprising:
using vias having conductive sidewalls as the holes in the support plate;
compressing each bulge into mechanical contact with the conductive sidewall of each via; and
conducting the electrical signals through the twist pin by electrically transferring the electrical signals between the opposite first and second ends of the twist pin.

26. A method of as defined in claim 20, wherein each twist pin includes multiple bulges formed along its length between its opposite ends, and the method further comprises:
contacting the multiple bulges of the twist pins with the sidewalls to prevent lateral tilting of the ends of the twist pins.

27. A method of as defined in claim 20, further comprising:
each twist pin has a length which extends its opposite first and second ends from each hole on and beyond respectively opposite sides of the support plate; and
moving a base plate into contact with the second ends of the twist pins to maintain the first ends of the twist pins in contact with the contact pads.

28. A method of as defined in claim 20, further comprising:
each twist pin has a length which extends its opposite first and second ends from each hole on and beyond respectively opposite sides of the support plate; and
resiliently forcing the second ends of the twist pins to induce longitudinal force through the twist pin for maintaining the first end of the twist pin in contact with the aligned contact pads.

29. A method of as defined in claim 20, further comprising:
each twist pin has a length which extends its opposite first and second ends from each hole on and beyond respectively opposite sides of the support plate; and
moving the twist pins longitudinally within the holes by movement of a base plate in contact with the second ends of the twist pins to establish contact of the first ends of the twist pins with the aligned contact pads.

30. A method of as defined in claim 20, further comprising:
each twist pin has a length which extends its opposite first and second ends from each hole on and beyond respectively opposite sides of the support plate; and
moving a reset plate into contact with the second ends of the twist pins to move the twist pins longitudinally in the holes after separating the first ends of the twist pins from contact with the contact pads.

31. A method of as defined in claim 20, further comprising:
each twist pin has a length which extends its opposite first and second ends from each hole on and beyond respectively opposite sides of the support plate; and
conducting the electrical signal to and from a circuit component having a plurality of contact areas located in aligned relationship with the plurality of contact pads;
respectively contacting the first and second ends with the contact pads and the contact areas with compressive force arising from compression of the bulge within the hole; and
conducting the electrical signal from the circuit component to the twist pins through the second ends in contact with the contact areas.

32. A method of as defined in claim 20, wherein the support plate includes nonconductive elastomeric material, and the method further comprises:
embedding the bulges of the twist pins within the nonconductive elastomeric material of the support plate.

* * * * *